United States Patent [19]

Bierhoff et al.

[11] Patent Number: 4,663,749
[45] Date of Patent: May 5, 1987

[54] APPARATUS FOR REPRODUCING INFORMATION FROM AN OPTICALLY READABLE RECORD CARRIER

[75] Inventors: Martinus P. M. Bierhoff; Job F. P. van Mil; Franciscus A. C. M. Schoofs; Albert H. Slomp, all of Eindhoven, Netherlands

[73] Assignee: U.S. Philips Corporation, New York, N.Y.

[21] Appl. No.: 722,647

[22] Filed: Apr. 12, 1985

[30] Foreign Application Priority Data

Jan. 11, 1985 [NL] Netherlands ............ 8500029

[51] Int. Cl.⁴ .................................. G11B 7/095
[52] U.S. Cl. .................................. 369/44; 369/111; 250/202
[58] Field of Search .................. 369/43, 44, 45, 46, 369/111, 124; 250/202; 330/288

[56] References Cited

U.S. PATENT DOCUMENTS

| 4,446,545 | 5/1984 | Dijk | 369/46 |
| 4,454,416 | 6/1984 | Gontowski | 330/288 |
| 4,475,182 | 10/1984 | Hosaka | 369/46 |
| 4,588,961 | 5/1986 | Rao | 330/288 |
| 4,591,804 | 2/1985 | Tuijl | 330/288 |

FOREIGN PATENT DOCUMENTS 3140956  5/1983  Fed. Rep. of Germany ...... 330/288

OTHER PUBLICATIONS

"Universal Current Mirror", by Radovsky, RCA Tech. Notes ©10/28/75.

Primary Examiner—Alan Faber
Attorney, Agent, or Firm—Thomas A. Briody; William J. Streeter; Marianne R. Rich

[57]  ABSTRACT

An apparatus is described for reading optically coded discs. In this apparatus the photodiode signals are amplified by current amplifiers which are biased by the unipolar photodiode signal currents, so that offset-free class-B operation is obtained.

5 Claims, 3 Drawing Figures

4,663,749

APPARATUS FOR REPRODUCING INFORMATION FROM AN OPTICALLY READABLE RECORD CARRIER

FIELD OF THE INVENTION

The invention relates to an apparatus for reproducing information from an optically readable record carrier on which information is stored in the form of a track of optically detectable areas alternating with intermediate areas, comprising an optical system for projecting a light beam on the record carrier, at least a first photodetector for detecting the light beam which has been modulated by the record carrier and for generating a signal which depends on the detected amount of light, an amplifier circuit for amplifying said signal and applying it to a control-signal generator for generating a control-signal, and positioning means for keeping the light beam positioned on the desired track under command of at least said control signal.

BACKGROUND OF THE INVENTION

Such an apparatus is known, inter alia as a video-disc player and as a compact-disc digital audio player, the latter being described comprehensively in "Phillips Technical Review", Vol. 40, 1982, No. 6, the entire issue. An example of, in particular the control-signal generator, is described in the previous Patent Application PHN No. 10.804 (NL No. 8303564).

In such apparatus both the information signal and the low-frequency signal for the various serve controls is derived from the signals from the photodetectors (four in said example) by amplifying the photo-detection signals through current-voltage conversion. Since the photo-currents are often very small, the amplifiers should have very low offset voltages in order to guarantee satisfactory and reliable control-signal generation, which demands either the use of low-offset amplifiers or an adjustment.

SUMMARY OF THE INVENTION

The invention aims at providing an apparatus of the type defined in the opening paragraph in which a satisfactory and reliable control-signal generation is obtained by means of relatively simple amplifiers and without adjustments.

To this end the invention is characterized in that the amplifier circuit comprises an input stage in the form of a current amplifier having an input current path arranged in series with the photo-detector, which current amplifier is of a type which the input current constitutes the bias current.

The invention is based on the recognition of the fact that the photo-detector signals are unipolar currents and may be employed as input signals for a quiescent-current-free current amplifier whose input signal also constitutes the bias current, which ensures that there is no output signal in the absence of an input signal or, in other words, that the amplifier is offset-free.

A preferred embodiment of the invention may be characterized further in that the current amplifier is constituted by a current-mirror arrangement.

Owing to the generally very small output signals of the photodetectors the amplifiers must have very high gain factors, which in the known apparatus is often achieved by the use of operational amplifiers. The resistance values of the resistors by means of which the gain factors of the op-amps are adjusted then often become very high (for example 1 MΩ), which is not attractive in the case of an integrated circuit. In the apparatus in accordance with the invention this problem can be solved very simply without resistors having high resistance values. To this end the apparatus in accordance with the invention may be characterized further in that a low-impedance direct-voltage source is arranged in the input path of said current-mirror arrangement in order to increase the gain factor of the current amplifier.

In addition to control signals, the information signal must be recovered. By means of an a.c. amplifier it is possible to extract only the a.c. components from the signal and the low-frequency components for the control signal can then be derived from these components by synchronous detection. However, this has the drawback that as a result of cross-talk the control signals may contain signal-spectrum components. Another possibility is to give the amplifier a very broad band and to separate the high-frequency and the low-frequency components through amplification. However, this imposes stringent requirements on the quality of the amplifier. A solution may then be to process the low-frequency components and the high-frequency components separately directly after the photo-detector. Since the input path of the current amplifier in the apparatus in accordance with the invention is arranged in series with the photodetector, the input impedance of this current amplifier then plays a part.

However, for the high-frequency components this impedance can be reduced by shunting the current amplifier with a capacitance.

This solution also reduces the high-frequency gain of this amplifier. A further characteristic feature of this apparatus is that the end of the photodetector which is remote from the current amplifier is connected to an amplifier for the information-signal components in the photodetector signal.

The invention will now be described in more detail, by way of example, with reference to the accompanying drawing, in which

DETAILED DESCRIPTION OF THE INVENTION

Figure 1:
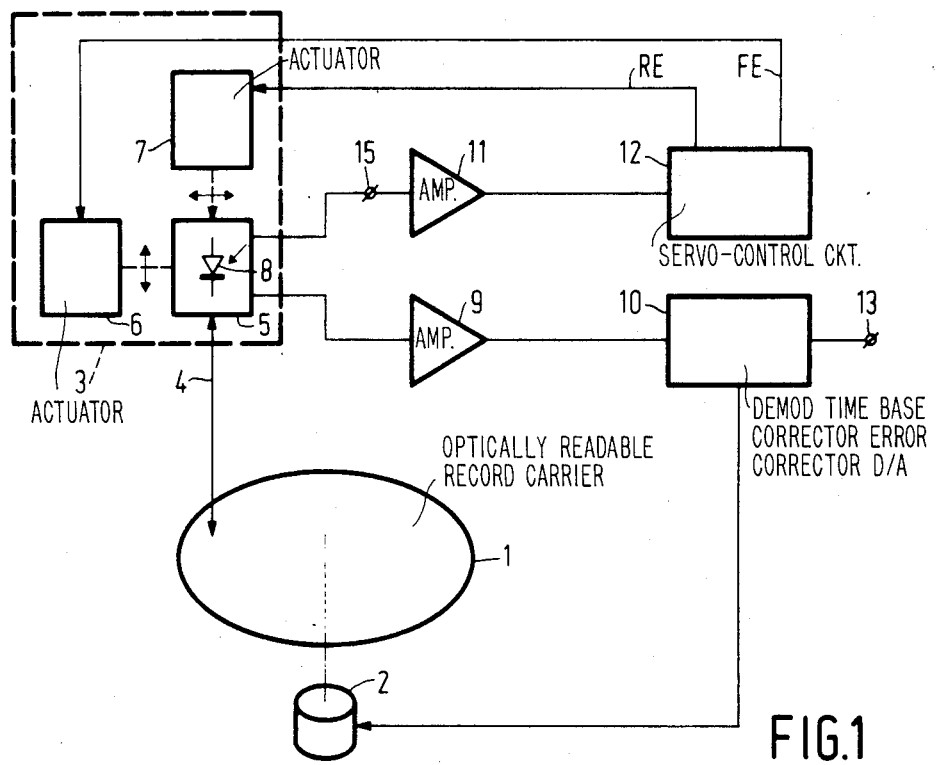
FIG. 1 is a block diagram of an apparatus in which the invention may be used.

FIG. 1 shows an apparatus for reproducing information from an optically readable record carrier 1. This record carrier 1 is rotated by means of a rotary motor 2. A system 3 ("light pen") projects a light beam 4 to form a read spot on the record carrier 1, after which the reflected beam is detected. For this purpose the system 3 comprisis an optical device 5 for generating and detecting this beam by means of a laser and a lens system, not shown, and a photodetector 8, an actuator 6 for controlling the focussing of this beam, and an actuator 7 for controlling the radial position of incidence of the beam on the disc.

The high frequency component of the signals supplied by the photodetector 8 is amplified by an amplifier 9, whose output signal is applied to a circuit 10 which may comprise, inter alia, a demodulator, a time-base corrector, an error corrector and a digital-to-analog converter and which produces the desired information signal on an output 13. This circuit 10 also supplies a control signal for the motor 2, which signal is based on the time base of the applied high-frequency signal.

The low-frequency component of the signals supplied by the photodetector 8 is amplified by an amplifier 11 and applied to a servo-control circuit 12 which generates control signals RE and FE for the actuators 6 and 7. These signals can be generated by means of various known systems which are based on the division of the photodetector 8 into, for example, 4 quadrants or into 4 in-line sections. By comparison of the amounts of light received by these sections, the signals RE and FE are obtained. For this, reference is made to the generally known principles as applied in the compact-disc digital audio players and in the video-disc player. This means that in the circuit 12 the signals from a plurality of photodiodes are processed, so that in practice a plurality of amplifiers 11 and, as the case may be, a plurality of circuits 12 are used, but for the sake of simplicity only one of them is shown in FIG. 1.

Figures 2, 3:
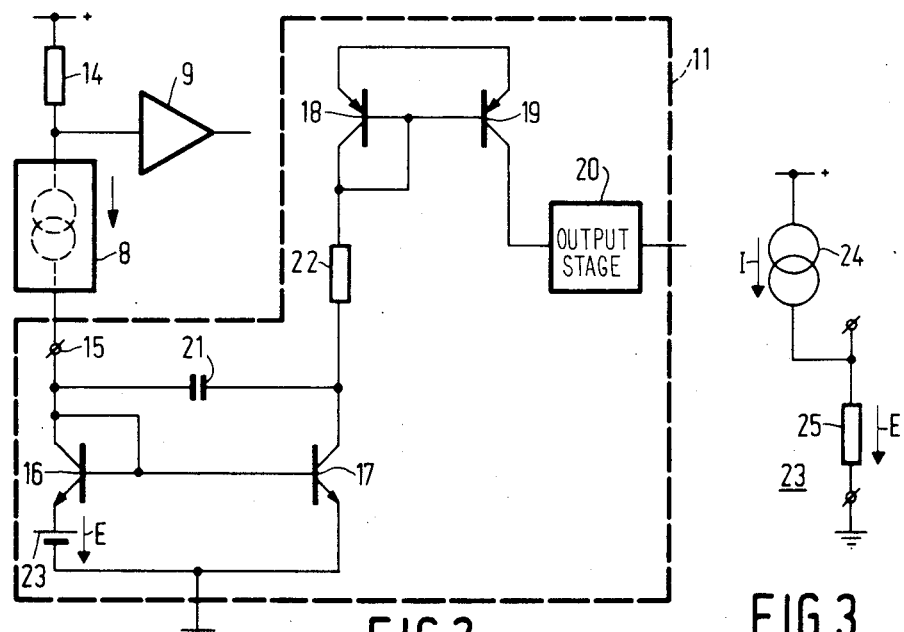
FIG. 2 shows an example of the amplifier 11 in the block diagram of FIG. 1.
FIG. 3 shows an example of the direct-voltage source 23 in the circuit shown in FIG. 2.

As already stated, the amplifier 11 should comply with some requirements, which in accordance with the invention are met by using a class-B current amplifier for the input stage of this amplifier 11. FIG. 2 shows an example of such an amplifier 11.

The photodiode 8, here represented by the symbol for a current source, is connected to a power-supply terminal via a resistor 14 and to the input 15 of the amplifier 11. The amplifier comprises an input stage constituted by a current mirror comprising transistors 16 and 17. This current mirror operates automatically in class B because its input current is the current supplied by the photodiode 8. The output transistor 17 of this current mirror is thus biassed by the signal current and does not produce an output current if the signal current is zero, so that it exhibits no offset. The collector of transistor 17 is connected to conventional output stage 20, not shown in detail, via a current mirror comprising transistor 18 and 19.

The signal for the high-frequency amplifier 9 may be taken from the junction point between the photodiode 8 and the resistor 14. For a correct transmission of the high-frequency component in the signal current from the photodiode 8 it is important that the input impedance of the amplifier 11 is low for the relevant part of the spectrum, so that the signal on the amplifier 9 is not influenced thereby. For this purpose a capacitor 21 is arranged across the current mirror comprising transistors 16 and 17, yielding a substantial reduction of the high-frequency gain of the amplifier 11 and of the input impedance, the capacitance of this capacitor being in effect increased owing to the Miller effect. To lay down the cross-over points in the input-impedance characteristic a resistor 22 is arranged between the collector of transistor 17 and the diode 18. In order to obtain a substantial increase in the gain of the combination of transistors 16 and 17 in comparison with the gain of the current mirror, a voltage source 23 of comparatively low impedance and with a direct voltage drop E is arranged in the emitter line of transistor 16 which, as shown in FIG. 3, can be obtained by feeding a direct current I from a current source 24 through a resistor 25 arranged between the emitter of the transistor 16 and earth. By the addition of this source 23 the gain (in the case of equal emitter areas) becomes equal to $qE/ekT$, where q is the charge of an electron, k is the Boltzmann constant and T is the absolute temperature.

Instead of the preamplifier 26 as shown here, any other type of current amplifier whose input current is the bias current may be used, which automatically ensures that a zero output current is obtained when the input current is zero, so that there is no offset.

What is claimed is:

1. In an apparatus for reproducing information from an optically readable record carrier, the record carrier having stored thereon information in the form of a track of optically detectable areas alternating with intermediate areas, the apparatus including an optical system for projecting a light beam on the record carrier, the optical system having:
   at least a first photodetector for detecting the light beam modulated by the record carrier and for generating a signal corresponding to the amount of detected light;
   an amplifier circuit for amplifying the signal;
   a control signal generator for receiving the amplified signal and for generating a control signal; and
   positioning means for keeping the light beam positioned on the desired track under command of at least the control signal;
   wherein the improvement of the amplifier circuit comprises:
   a current amplifier connected to the photodetector, the current amplifier acting as the input stage of the amplifier circuit, the current amplifier using the signal inputted from the photodetector as the biasing current; thereby effecting an offset-free amplifier.

2. An apparatus according to claim 1, wherein the current amplifier comprises a current mirror arrangement.

3. An apparatus according to claim 2, further comprising:
   a low impedance direct voltage source arranged in the input path of the current mirror arrangement for increasing the gain factor of the current amplifier.

4. An apparatus according to claim 1, wherein the current amplifier is shunted with a capacitance for substantially reducing the high frequency gain of the amplifier.

5. An apparatus according to claim 4, wherein the end of the photodetector not connected to the current amplifier is connected to a second amplifier for amplifying the information signal components of the photodetector signal.

* * * * *